United States Patent [19]
Melcher et al.

[11] Patent Number: 5,961,714
[45] Date of Patent: Oct. 5, 1999

[54] METHOD OF GROWING LUTETIUM ALUMINUM PEROVSKITE CRYSTALS AND APPARATUS INCLUDING LUTETIUM ALUMINUM PEROVSKITE CRYSTAL SCINTILLATORS

[75] Inventors: Charles L. Melcher, West Redding; Jeffrey S. Schweitzer, Ridgefield, both of Conn.

[73] Assignee: Schlumberger Technology Corporation, Ridgefield, Conn.

[21] Appl. No.: 08/612,343

[22] Filed: Mar. 7, 1996

[51] Int. Cl.$^6$ ..................................... G30B 15/22
[52] U.S. Cl. .............. 117/13; 117/15; 117/937; 117/950
[58] Field of Search .............. 117/14, 15, 937, 117/950; 250/483.1

[56] References Cited

U.S. PATENT DOCUMENTS

| 4,958,080 | 9/1990 | Melcher | 250/483.1 |
| 5,025,151 | 6/1991 | Melcher | 250/483.1 |
| 5,660,627 | 8/1997 | Manenter et al. | 117/13 |

FOREIGN PATENT DOCUMENTS

| 406183877 | 7/1994 | Japan . | |

OTHER PUBLICATIONS

"Facetting and optical perfection in Czochralski grown garretts and ruby"; Cockayne, et al; Journal of Material Science (May 1969); vol. 4; No. 5 pp. 450–456 (Abstract Only!), 1969.

Ivanov, et al., "Luminescene of Neodymium Ions in Single Crystals of Lutecium Orthoaluminate," *Opt. Spectrosc.,* vol. 38, No. 2 (Feb. 1975), pp. 230–232.

Anan'eva, et al., "Preparation and Physical Properties of Perovskite–like Ytterbium and Lutecium Aluminates," *Soc. Phys. Crystallogr.* 23(1), Jan.–Feb. 1978, pp. 108–110.

I. A. Bondar et al., Ddokl. Akad. Nauk. SSSR 246 (1979) 1132–1136.

A. G. Petrosyan, "Crystal Growth of Laser Oxides in the Vertical Bridgman Configuration," *Journal of Crystal Growth 139* (1994) pp. 372–392.

W. W. Moses et al., "LuAlO$_3$:Ce—A High Density, High Speed Scintillator for Gamma Detection," *IEEE Transactions on Nuclear Science,* (Nov. 1994).

Lempicki et al., "LuAlO$_3$:C e and Other Aluminate Scintillators," *IEEE Trans. Nucl. Sci.,* 42, (Aug. 1995) pp. 280–284.

Moszynski et al., "LuAP, A New Fast Scintillator," *Preprint—Proceedings of SCINT 95 Conference,* Aug. 1995, Delft, The Netherlands.

A. G. Petrosyan, et al. "Preparation of Single Phase LuAlO$_3$:C e Scintillator Crystals," *Preprint—Proceedings of SCINT 95 Conference,* Aug 19955, Delft, The Netherlands.

A. Lempicki et al., "Lutetium Aluminate: Spectroscopic and Scintillation Properties," paper presented at *IEEE Nucl. Sci. Symp.,* Oct. 1995, San Francisco, CA.

Bardsley, et al., "Crystal Growth: A Tutorial Approach," (eds) *North–Holland Publishing Company* (1979) pp. 189–215.

(List continued on next page.)

*Primary Examiner*—Felisa Garrett
*Attorney, Agent, or Firm*—Leonard W. Pojunas; Keith G. W. Smith; William B. Batzer

[57] ABSTRACT

A method for producing lutetium aluminum perovskite crystals includes heat aging the crystal melt and maintaining the interface between a crystal and the melt from which it is pulled substantially flat as the crystal is grown. In a Czochralski growth method, the rate of rotation of the crystal and its diameter are typically controllable to provide the flat interface as the crystal is pulled. Crystals produced by this method exhibit less variability in scintillation behavior which allows larger crystals to be produced from a boule making them particularly suitable for spectroscopic uses. Such crystals find uses in borehole logging tools.

13 Claims, 4 Drawing Sheets

OTHER PUBLICATIONS

T. Utsu et al., "Growth and Applications of Gd2SiO5:C2 Scintillators," *Journal of Crystal Growth* 109 (1991) pp. 385–391.

C. L. Melcher, et al., "Cczochralski Growth of Rare Earth Oxyorthosilicate Single Crystals", *Journal of Crystal Growth* 128 (1993), pp. 1001–1005.

C. L. Melcher, et al., "A Macintosh–based System For Czochralski Crystal Growth", *Scientific Computing and Automation* (Jan. 1994) pp. 39–45.

METHOD OF GROWING LUTETIUM ALUMINUM PEROVSKITE CRYSTALS AND APPARATUS INCLUDING LUTETIUM ALUMINUM PEROVSKITE CRYSTAL SCINTILLATORS

BACKGROUND OF THE INVENTION

1. Field of the Invention

The present invention relates to a method of growing lutetium aluminum perovskite crystals and in particular to a method for growing such crystals for use as scintillators. The invention also provides improved scintillation detectors incorporating such crystals.

2. Description of the Prior Art

Cerium doped lutetium aluminum perovskite crystals ($LuAlO_3$:Ce, hereinafter "LuAP") are known to be useful as scintillators for γ ray and x-ray detectors. Reports of the use of LuAP as a scintillator and its characteristics can be found in A. O. Ivanov et al, Opt. Spectrosc., Vol. 38, No. 2, February 1975 (230–232), G. V. Anan'eva et al, Sov. Phys. Crystallogr. 23(1), January-February 1978, I. A. Bondar et al, Dokl. Akad. Nauk. SSSR 246 (1979) 132, A. G. Petrosian, Journal of Crystal Growth 139 (1994) 372–392, W. W. Moses et al, IEEE Trans. Nucl. Sci. November 1994, A. Lempicki et al, IEEE Trans. Nucl. Sci. 42, August 1995, 280–284, M. Moszynski et al, (LuAP, A New Fast Scintillator) Preprint—Proceedings of SCINT 95 Conference, August 1995, Delft, The Netherlands, A. G. Petrosyan et al, (Preparation of Single Phase $LuAlO_3$—Ce Scintillator Crystals) Preprint—Proceedings of SCINT 95 Conference, August 1995, Delft, The Netherlands, and A. Lempicki et al (Lutetium Aluminate: Spectroscopic and Scintillation Properties) paper presented at IEEE Nucl. Sci. Symp., October 1995, San Francisco, USA One particular use of crystal scintillators is in the field of borehole logging in which measurements of γ rays (and x rays) are used to determine properties of underground formations surrounding a borehole. In such applications, the amount of space available for detectors is often limited and so it is not possible to use a large number of small crystal scintillators, each with its own photomultiplier as is done for example in medical imaging applications. Thus for borehole logging applications, it is desirable to use one or a few relatively large, single crystal scintillators which have good light output. While LuAP shows properties which would make it a likely candidate for use as a scintillator for borehole applications, it has heretofore been impossible to grow crystals large enough to provide the performance required for such applications. In all of the prior art referenced above, the largest samples reported are of the order of <0.1 $cm^3$ which is too small to be effective in borehole applications.

U.S. Pat. No. 4,958,080 and U.S. Pat. No. 5,025,151 (both incorporated herein by reference) describe a single crystal scintillator formed from a melt of formula $Ce_{2x}Lu_{2(1-x)}SiO_5$, wherein $2\times10^{-4}<x<3\times10^{-2}$ (hereinafter the term LSO will be used as shorthand for this formula). The method proposed for growing LSO is the Czochralski crystal growth method which is generally described in the publication CRYSTAL GROWTH: A TUTORIAL APPROACH, W. Bardsley, D. T. J. Hurle, J. B. Mullins (eds) North-Holland Publishing Company, 1979, pp 189–215. This method has been used for growing scintillator crystals as is described in "Growth and applications of Gd2SiO5:Ce scintillators" T. Utsu and S. Akiyama, Journal of Crystal Growth 109 (1991) 385–391 for gadolinium orthosilicate scintillators and in "Czochralski growth of rare earth oxyorthosilicate single crystals" C. L. Melcher, R. A. Manente, C. A. Peterson and J. S. Schweitzer, Journal of Crystal Growth 128 (1993) 1001–1005, and "A Macintosh-based System For Czochralski Crystal Growth" C. L. Melcher, R. A.Manente, C. A. Peterson, J. S. Schweitzer, M. A. Singelenberg and F. J. Bruni, Scientific Computing and Automation, January 1994 39–45 for LSO scintillators. The Czochralski method can also be used to grow LuAP.

While this method can be used to make scintillator crystals which are useful in certain applications, there is variability between the scintillation behavior of different crystals cut from a single boule of LSO or LuAP. This variability has not been seen in any other property than the scintillation behavior, i.e. to all other intents and purposes, the boule appears to be homogenous, but the resulting crystals have γ-ray spectra with broad or multiple peaks. However, for spectroscopic uses of LSO or LuAP crystal scintillators, it is desirable that the scintillation behavior be as uniform as possible.

It is an object of the present invention to provide a method for producing LuAP crystals for use as scintillators which display substantially uniform scintillation behavior throughout the crystal.

It is another object of the present invention to provide an improved Czochralski crystal growth method for producing LuAP crystals.

SUMMARY OF THE INVENTION

The present invention provides a method for producing LuAP crystals in which the interface between a crystal and the melt from which it is pulled is maintained substantially flat as the crystal is grown. In a Czochralski growth method, the rate of rotation of the crystal and its diameter are typically controllable to provide the flat interface as the crystal is pulled.

In a preferred embodiment, the melt is heat aged before the crystal is pulled. The heat aging comprises maintaining the melt at a temperature above melting for a period of time prior to formation of a boule.

The shape of the solid-to-liquid interface is determined by the shape of the freezing isotherm. Consequently, the objects of the invention are achieved by controlling the shape of the freezing isotherm during the main part of the crystal growth. There may be some variation from the desired conditions at the beginning and end of the growth. The thermal conditions are determined by crucible size and location in the heating environment, furnace design, insulating materials employed and flow pattern of the liquid melt. The flow pattern of the liquid melt is a function of melt viscosity, crystal diameter relative to crucible diameter and crystal rotation rate. By heat aging the melt and maintaining the flat interface, it is possible to produce LuAP scintillator crystals which are at least an order of magnitude larger than those reported in the prior art while avoiding formation of the garnet phase which can also be produced from such a melt composition but which has undesirable scintillation properties.

DESCRIPTION OF THE PREFERRED EMBODIMENT

The procedure used to grow LuAP crystals according to the invention is substantially as described in U.S. patent application Ser. No. 08/330,051 (incorporated herein by reference) which is modified or adapted as will be described below.

The present invention includes two aspects which must be considered in the production of useful crystal scintillators. The first is the production of a boule of LuAP for which the scintillation properties are substantially homogenous. This is achieved in the same manner as for LSO as described in the '051 application by controlling the rate of rotation and rate of pulling of the crystal from the melt. The second is to ensure the formation of the perovskite phase rather than the garnet phase which has poor scintillation properties. This is achieved by heat aging the melt prior to pulling the crystal.

Four different growth runs are summarized in the table below. In each case the melt was formed in an iridium crucible as is described in the '051 application and aged overnight near the melting point of LuAP followed by a preheating phase at a higher temperature prior to pulling the crystal on an iridium wire in the same manner as LSO. Problems can occur with this method due to melting of the iridium crucible as occurred twice when attempting growth runs in accordance with the invention. Consequently, the preheating phase in the growth runs summarized below might be less than optimum. Longer periods and/or higher temperatures might be used to effect if suitable robust crucibles are available.

125° C. in an air atmosphere for 1 hour or at 1600° C. in an Ar+ 2% $H_2$ atmosphere for several hours or any other suitable annealing regime.

The formation of the perovskite phase from the melt is indicated by the formation of a clear boule (some cracks might be present). The growth run which resulted in the production of the garnet phase (polycrystalline, opaque boule with a yellow-green color) did not preheat the melt to a sufficiently high temperature, the extended duration of heating failing to mitigate this. X-ray diffraction confirms the presence of the perovskite phase in the clear boules which has a density of 8.34 g/cm³. The cerium content of the melt is selected to give optimum performance. This can be in the range of up to 5% or higher if appropriate.

Crystal scintillators produced according to the invention are rugged and non-hygroscopic and have the following properties:

Light Output 43% of NaI
Wavelength (nm) 380
Decay Time (ns) 16 (primary)
Effective Atomic Number 65
Density (g/cm³) 8.34

Figure 1:
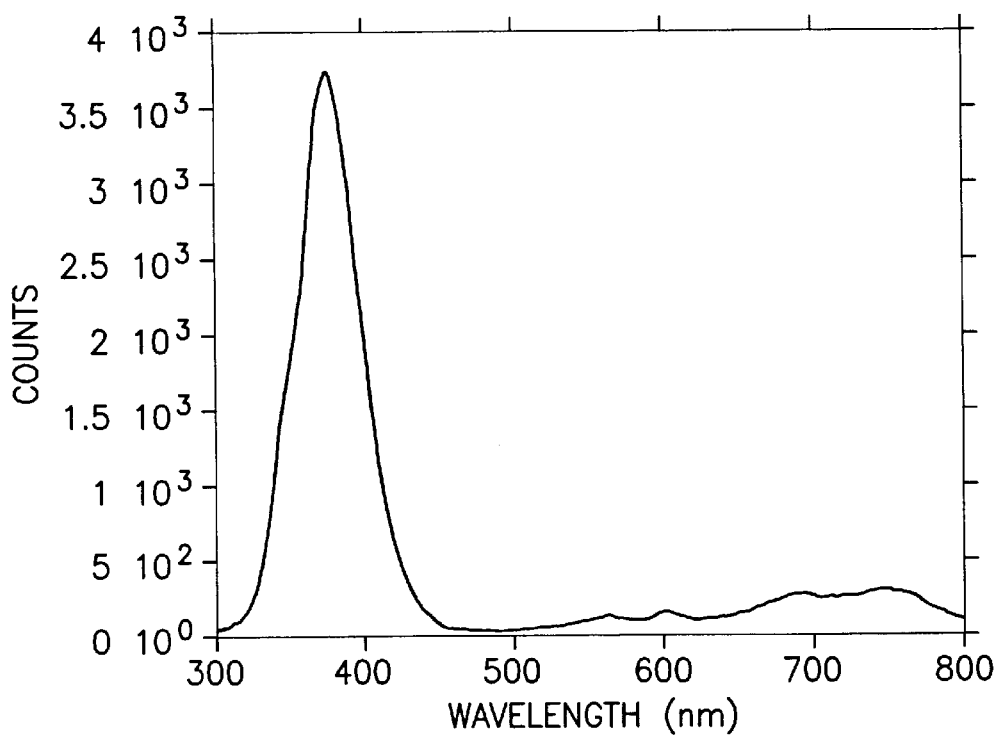
FIG. 1 shows the emmission spectrum of LuAP under γ ray excitation.

FIG. 1 shows the emission spectrum of LuAP, under gamma-ray excitation from an $^{241}$Am source, which peaks at 380 nm, a wavelength which matches well with photomultiplier tubes (PMTs) with sapphire faceplates (or quartz or other UV-transmissive faceplates). The emissions at longer wavelengths of 500—800 nm may be the result of impurities or crystal defects. These are of little consequence when using such PMTs but may be more significant if photodiodes are used.

Figure 2:
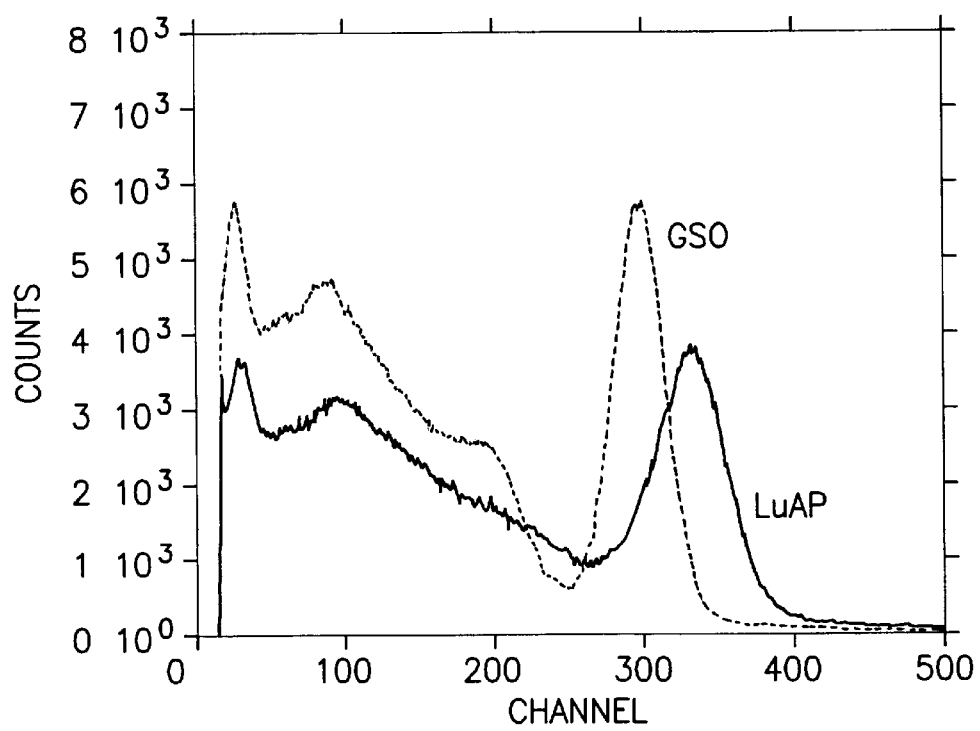
FIG. 2 shows a comparison of $^{137}Cs$ pulse height spectra for LuAP and GSO.

FIG. 2 shows a comparison of pulse height spectra of $^{137}$Cs taken with a 14×10×7 mm (~1cm³) crystal of LuAP and a similar sized crystal of GSO. The spectra are obtained using an EMR 741Y PMT operated at 1300 V; the crystals are wrapped with Teflon tape reflectors and coupled with optical grease. The GSO crystal (0.5% Ce) is a premium quality sample with a light output of 11,400 photons/MeV at room temperature. The light output of the LuAP crystal is ~12% higher or 12,800 photons/MeV. The energy resolution at 662 keV is 15.5% for LuAP vs. 12.5% for GSO. Although

| Melt Composition | Atmosphere | Rotation Rate | Growth Rate | Preheating* | Result |
|---|---|---|---|---|---|
| $Lu_2O_3$: 596.44 g<br>$Al_2O_3$: 153.13 g<br>$CeO_2$: 1.034 g<br>(0.2% Ce) | $N_2$ | 60 rpm | 2 mm/hr | MP + 6.5%<br>(~MP + ~90° C.)<br>for 1.5 hrs | clear boule |
| $Lu_2O_3$: 571.58 g<br>$Al_2O_3$: 147.93 g<br>$CeO_2$: 4.994 g<br>(1.0% Ce) | $N_2$ | 65 rpm | 2 mm/hr | MP + 2.7%<br>(~MP + ~37° C.)<br>for 12 hrs | yellow-green boule = garnet phase |
| $Lu_2O_3$: 609.68 g<br>$Al_2O_3$: 157.792 g<br>$CeO_2$: 5.327 g<br>(1.0% Ce) | $N_2$ | 67 rpm | 2 mm/hr | MP + 5.5%<br>(~MP + ~76° C.)<br>for 1.5 hrs | clear boule |
| $Lu_2O_3$: 609.68 g<br>$Al_2O_3$: 157.792 g<br>$CeO_2$: 5.327 g<br>(1.0% Ce) | first half: $N_2$<br>second half:<br>$N_{2 + 3000}$ ppm $O_2$ | 67 rpm | 2 mm/hr | MP + 6.5%<br>(~MP + ~90° C.)<br>for 1.5 hrs | clear boule |

*In the setup used here, there is no way to measure the temperature directly, only the power of the RF generator. In the table MP + X% indicates an increase of X% over the power required to melt the mixture of raw materials. The estimate of temperature is derived from a knowledge of the melting point of LuAP (1960° C.) and LSO (2170° C.) and the RF power required to reach these temperatures.

After the crystal has been drawn from the melt, annealing might be appropriate. This can take the form of holding at the energy resolution of LuAP is broader than might be expected on the basis of light output, the photopeak is symmetric confirming that the flat interface growth improves the homogeneity of the scintillator.

Figure 3:
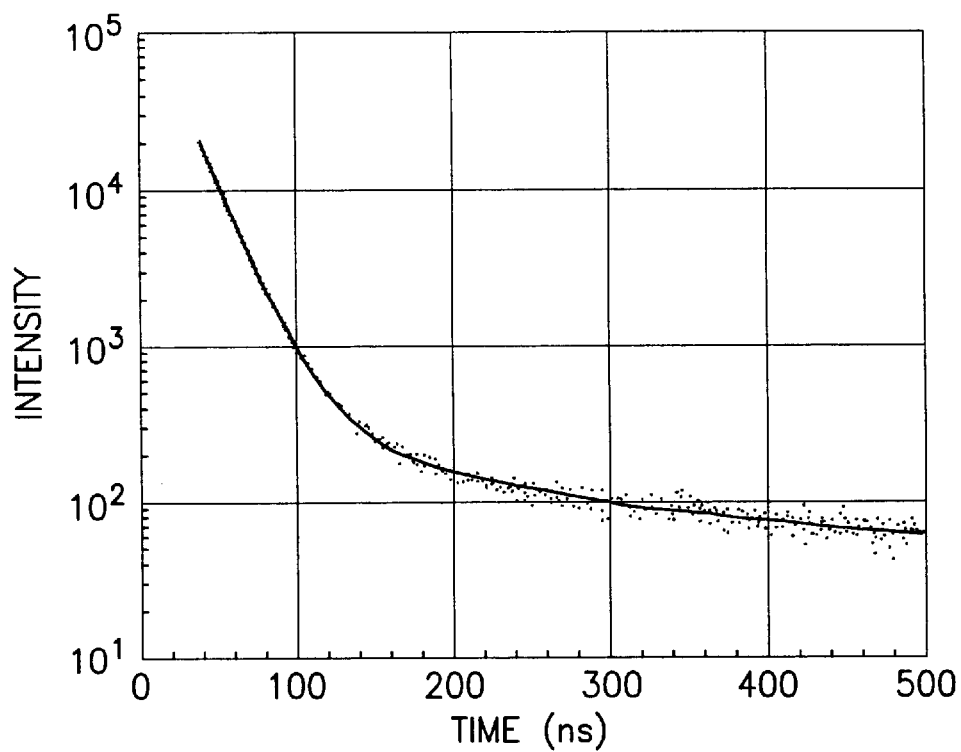
FIG. 3 shows the decay time of LuAP under γ ray excitation with $^{137}Cs$.

The decay time of LuAP measured with time correlated single photon technique (gamma-ray excitation with $^{137}$Cs) is shown in FIG. 3. About 67% of the total emission is contained in the fastest component of 16.5 ns. The rise time is very fast (<2 ns), indicating rapid energy transfer to the scintillation centers.

Figure 4:
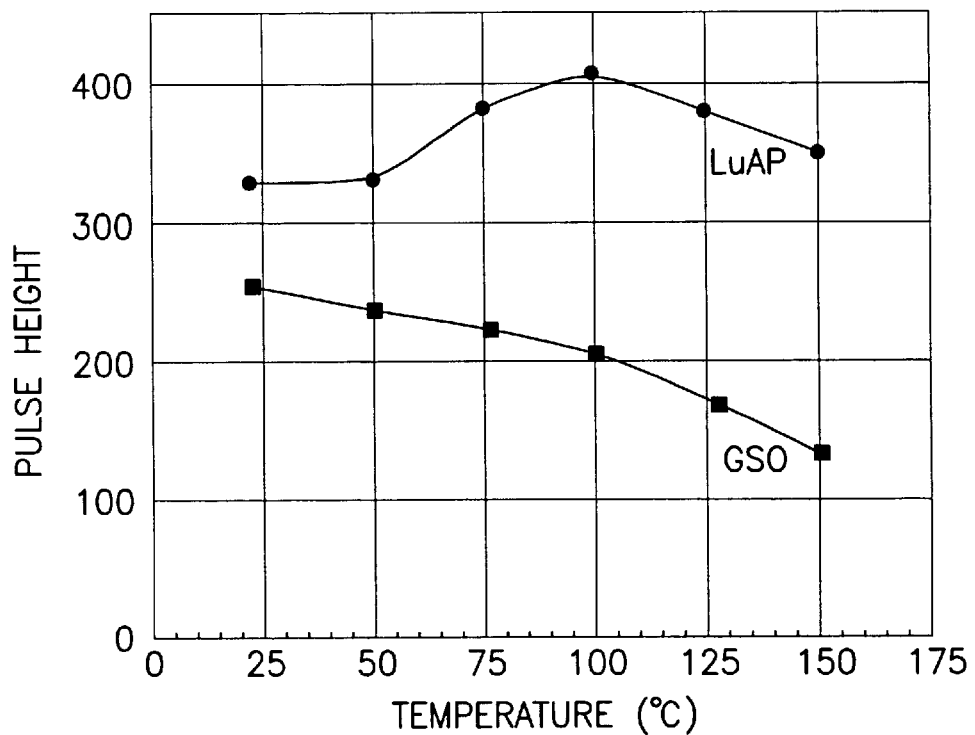
FIG. 4 shows the light output as a function of temperature for LuAP and GSO.
Figure 5:
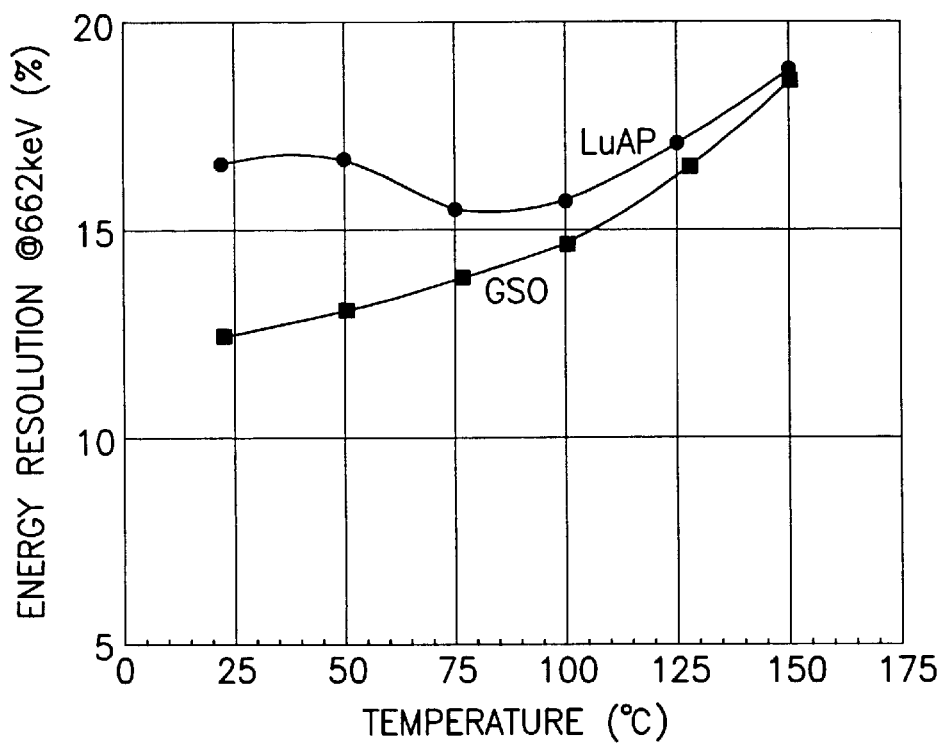
FIG. 5 shows the energy resolution as a function of temperature for LuAP and GSO.

The temperature response of the 14×10×7 mm LuAP crystal is measured by coupling the crystal to a 741Y PMT and heating the combination to 150° C. Pulse height spectra of $^{137}$Cs are recorded at 25° C. intervals. The light output as measured by the photopeak centroid is compared to GSO measured under the same conditions and is shown in FIG. 4. The light output increase up to 100° C. and decreases only slightly at higher temperatures. The light output at 150° C. is higher than at room temperature. FIG. 5 shows the energy resolution at 662 keV as a function of temperature for the same crystals. The GSO sample energy resolution varies from 12.5% at room temperature to 18.6% at 150° C. LuAP shows a smaller varation of 15.5% to 18.9%.

Figure 6:
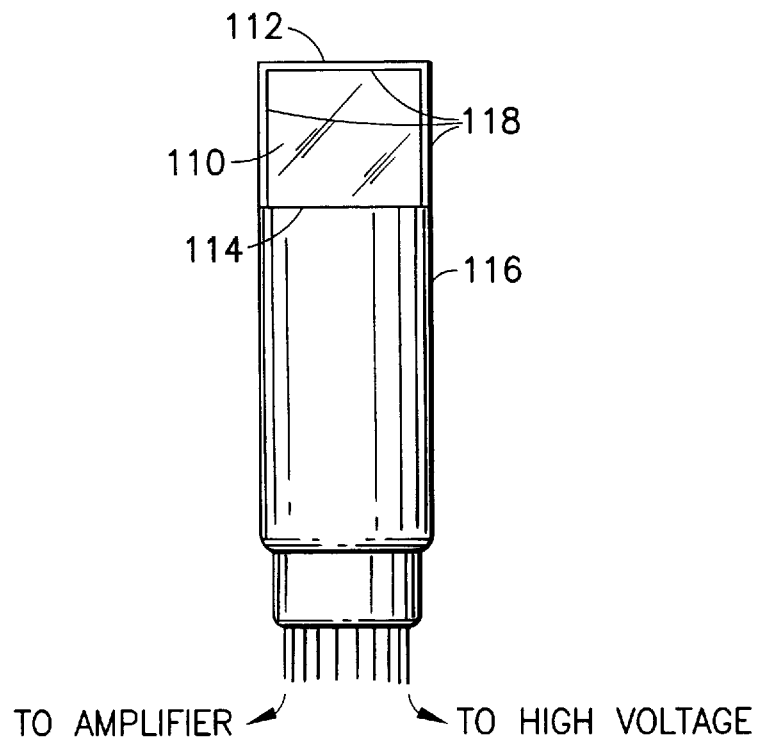
FIG. 6 shows a γ ray detector incorporating a scintillator according to the invention.

FIG. 6 shows a diagrammatic view of an LuAP scintillation detector in which the LuAP produced according to the above described method can be used. In FIG. 6 a single crystal LuAP scintillator 110 is shown encased within the housing 112 of a gamma-ray detector. One face 114 of the scintillator is placed in optical contact with the photosensitive surface of a photomuliplier tube 116. Alternatively, the light pulses could be coupled to the photomultiplier via light guides or fibers, lenses, mirrors, or the like. The photomultiplier can be replaced by any suitable photodetector such as a photodiode, microchannel plate, etc. In order to direct as much of each light flash to the photomultiplier as possible, the other faces 118 of the scintillator are preferably surrounded or covered with a reflective material, e.g. Teflon tape, magnesium oxide powder, aluminum foil, or titanium dioxide paint. Light pulses emitted by the LuAP crystal upon the incidence of radiation are intercepted, either directly or upon reflection from the surfaces 118, by the photomultiplier, which generates electrical pulses or signals in response to the light pulses. These electrical output pulses are typically first amplified and then subsequently processed as desired, e.g. in a pulse height amplifier, to obtain the parameters of interest regarding the detected radiation. The photomultiplier is also connected to a high voltage power supply, as indicated in FIG. 6. Other than the LuAP scintillator, all of the components and materials referred to in connection with FIG. 6 are conventional and thus need not be described in detail.

The LuAP scintillator detector of FIG. 6 is particularly effective as a radiation detector in a borehole logging environment, such as for petroleum exploration. In such use, the detector forms part of a logging system which may be of the type illustrated in FIG. 7.

Figure 7:
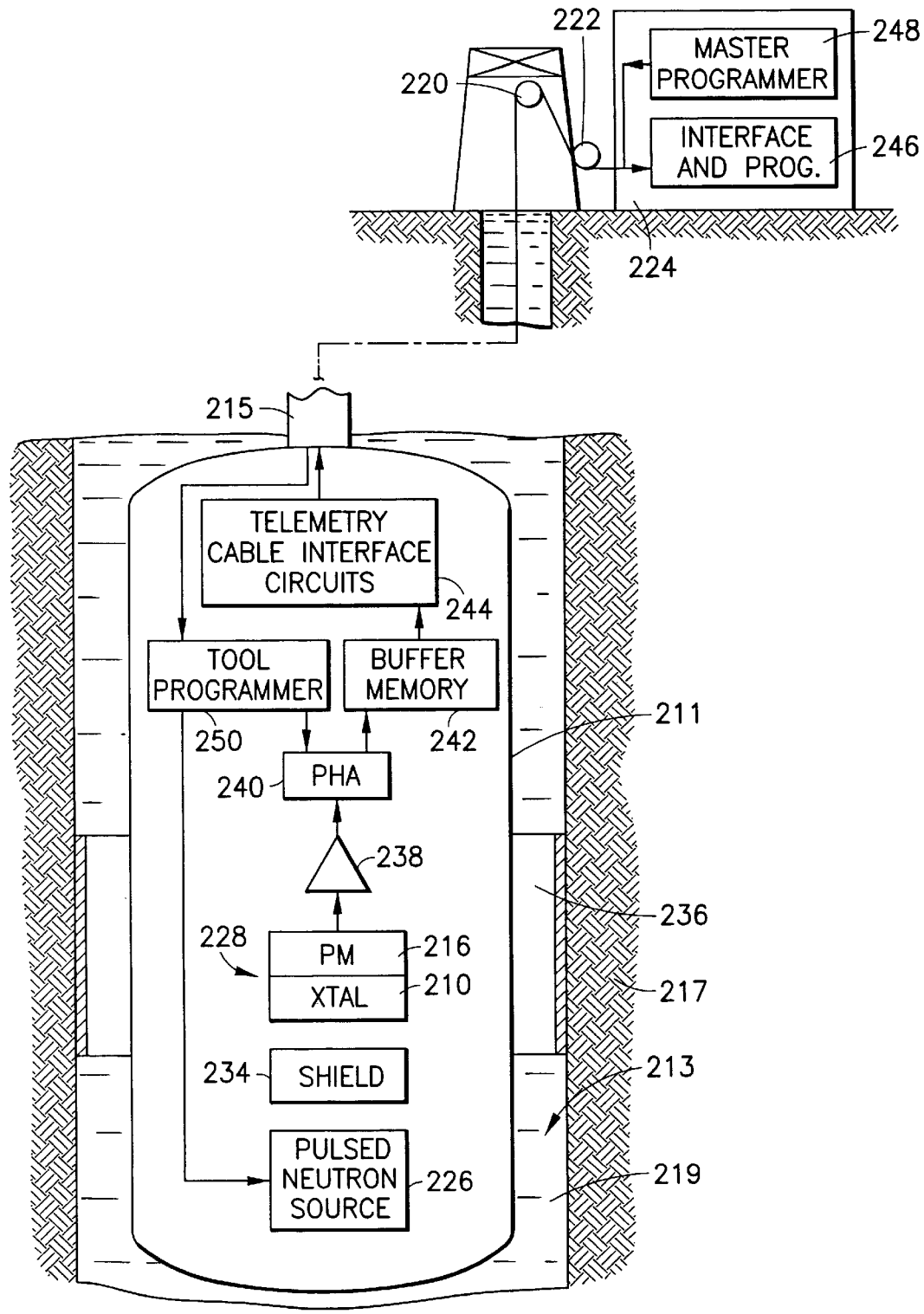
FIG. 7 shows a borehole logging tool incorporating a detector as shown in FIG. 6.

FIG. 7 shows a logging sonde 211 for sensing gamma radiation resulting from bombardment of a formation with high energy neutrons and detecting the energy of the radiation for subsequent spectral analysis. The sonde 211 is suspended in a borehole 213 on an armored multiconductor cable 215. The borehole 213 traverses a formation 217 and is filled with fluid 219, and may be open as shown or cased. The sonde 211 as described below may be constructed in accordance with U.S. Pat. No. 4,317,993. The sonde 211 is moved in the borehole 213 by playing the cable 215 out and reeling it back in over a sheave wheel 220 and a depth gauge 222 by means of a winch forming part of surface equipment 224. Usually the logging measurements are actually made while the sonde 211 is being raised back up the borehole 213, although in certain circumstances they may be made on the way down instead or as well.

The sonde 211 includes a pulsed neutron source 226 for producing primary radiation to bombard the formation 217 with fast neutrons as the sonde 211 travels up the borehole 213, and a radiation detector 228 for detecting secondary (gamma) radiation induced thereby in the borehole 213 and the formation 217. The neutron source 226 is preferably of the pulsed accelerator type described in U.S. Pat. No. 3,461,291 and U.S. Pat. No. 3,546,512. This type of source is particularly suited to the generation of discrete bursts of high energy or fast neutrons, e.g. at 14 MeV, with a controlled duration and repetition rate.

The detector 228 is of a type appropriate to the detection of gamma radiation and the production of an electrical signal corresponding to each detected gamma ray and having an amplitude representative of the energy of the gamma ray. To this end the detector 228 is shown in FIG. 6 including a cerium-activated LuAP scintillation crystal 210 optically coupled to a photomultiplier tube (PMT) 216. Suitable tubes are manufactured by EMR Photoelectric, Princeton, N.J.

A neutron shield 234 may be located between the source 226 and the detector 228 to limit direct bombardment of the detector 228 by neutrons from the source 226, thereby avoiding saturation of the detector 228 by such direct irradiation. In addition, especially in the case of measurement of capture gamma radiation, the sonde 211 may be surrounded by a sleeve 236 impregnated with boron carbide and located in the general vicinity of the source 226 and the detector 228. This sleeve displaces borehole fluid in the region of the detector 228, and absorbs neutrons scattered by the formation towards the detector 228, without significantly attenuating gamma radiation emanating from the formation. The net effect is to reduce the possibility of neutron interactions with the borehole contents and the material of the sonde 211 in proximity to the detector 228 and which would otherwise produce detectable gamma rays constituting an undesirable perturbation of the required gamma ray measurement.

Electrical power for the sonde 211 is supplied via the cable 215 from the surface equipment 224. The sonde 211 includes power conditioning circuitry (not shown) for feeding power at appropriate voltage and current levels to the source 226, the detector 228 and other downhole circuits. These circuits include an amplifier 238 and associated circuitry which receives the output pulses from the PMT 216. The amplified pulses are then applied to a pulse height analyzer (PHA) 240 including an analog-to-digital converter which may be of any conventional type such as the single ramp (Wilkinson rundown) type. Other suitable analog to digital converters may be used for the gamma ray energy range to be analyzed. Linear gating circuits may also be employed for control of the time portion of the detector signal frame to be analyzed. Improved performance can be obtained by the use of additional conventional techniques such as pulse pile-up rejection.

The pulse height analyzer 240 assigns each detector pulse to one of a number (typically in the range 256 to 8000) of predetermined channels according to its amplitude (i.e. the gamma ray energy), and produces a signal in suitable digital form representing the channel or amplitude of each analyzed pulse. Typically the pulse height analyzer 240 includes memory in which the occurrences of each channel number in the digital signal are accumulated to provide an energy spectrum. The accumulated totals are then transferred via a buffer memory 242 (which can be omitted in certain circumstances) to telemetry and cable interface circuits 244 for transmission over the cable 215 to the surface equipment 224.

At the surface the cable signals are received by cable interface and signal processing circuits 246. It will be understood that the circuits 244 and 246 may be of any suitable known construction for encoding and decoding, multiplexing and demultiplexing, amplifying and otherwise processing the signals for transmission to and reception by the surface equipment 224. Appropriate circuits are described, for example, in U.S. Pat. No. 4,012,712.

The operation of the sonde 211 is controlled by signals sent downhole from a master programmer 248, located in the surface equipment 224. These signals are received by a tool programmer 250 which transmits control signals to the neutron source 226 and the pulse height analyzer 240.

The surface equipment 224 includes various electronic circuits used to process the data received from the downhole equipment, analyze the energy spectrum of the detected gamma radiation, extract therefrom information about the formation 217 and any hydrocarbons that it may contain, and produce a tangible record or log of some or all of this data and information, for example on film, paper or tape. These circuits may comprise special purpose hardware or alternatively a general purpose computer appropriately programmed to perform the same tasks as such hardware. Details of such analysis may be found for example in U.S. Pat. No. 3,521,064.

In the above embodiment, the scintillator is located in a wireline sonde or tool body. The invention also finds application in logging-while-drilling tools which operate in a similar manner.

We claim:

1. A method of growing lutetium aluminum perovskite crystals, comprising forming a melt of lutetium aluminum perovskite, heating the melt to a temperature substantially above the melting point of lutetium aluminum perovskite and maintaining the melt at this temperature for a period of time, and then forming a crystal therefrom while maintaining a substantially flat interface between the crystal and the melt.

2. A method as claimed in claim 1, wherein the temperature is at least about 5% higher than the melting point of lutetium aluminum perovskite.

3. A method as claimed in claim 2, wherein the temperature is from 5% to 7% higher than the melting point of lutetium aluminum perovskite.

4. A method as claimed in claim 1, wherein the period of time is not less than 1 hour.

5. A method as claimed in claim 4, wherein the period of time is about 1.5 hours.

6. A method as claimed in claim 1, wherein the crystal produced from the melt is in the form of a boule, the method further comprising dividing the boule into individual scintillator crystals.

7. A method as claimed in claim 1, wherein the lutetium aluminum perovskite melt contains cerium.

8. A method as claimed in claim 7, wherein the melt contains up to about 5% cerium.

9. A method as claimed in claim 1, comprising a Czochralski crystal growth method.

10. A method as claimed in claim 9, wherein the Czochralski crystal growth method comprises drawing an approximately cylindrical crystal from the melt while rotating the crystal at a controlled rotation rate, the rotation rate and the diameter of the crystal being controlled so as to maintain a substantially flat interface.

11. Lutetium aluminum perovskite when produced by a method comprising forming a melt of lutetium aluminum perovskite and forming a crystal therefrom while maintaining a substantially flat interface between the crystal and the melt.

12. Lutetium aluminum perovskite as claimed in claim 11, containing up to about 5% of cerium.

13. A scintillator comprising a crystal of lutetium aluminum perovskite produced by a method comprising forming a melt of lutetium aluminum perovskite, heating the melt to a temperature substantially above the melting point of lutetium aluminum perovskite and maintaining the melt at this temperature for a period of time and forming a crystal therefrom while maintaining a substantially flat interface between the crystal and the melt.

* * * * *